United States Patent
Waite et al.

(10) Patent No.: US 8,159,030 B2
(45) Date of Patent: Apr. 17, 2012

(54) STRAINED MOS DEVICE AND METHODS FOR ITS FABRICATION

(75) Inventors: Andrew Michael Waite, Hopewell Junction, NY (US); Scott Lunning, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 383 days.

(21) Appl. No.: 11/775,619

(22) Filed: Jul. 10, 2007

(65) Prior Publication Data

US 2008/0012018 A1   Jan. 17, 2008

Related U.S. Application Data

(62) Division of application No. 11/292,410, filed on Nov. 30, 2005, now abandoned.

(51) Int. Cl.
    *H01L 21/336* (2006.01)
(52) U.S. Cl. ........ 257/347; 257/510; 257/327; 257/369; 438/197
(58) Field of Classification Search .................. 438/199, 438/197, 202, 752, 933, 258; 257/19, 55, 257/63, 65, 69, 204, 616, 742
See application file for complete search history.

(56) References Cited

U.S. PATENT DOCUMENTS

| | | | |
|---|---|---|---|
| 6,238,960 B1 * | 5/2001 | Maszara et al. | 438/197 |
| 6,703,271 B2 * | 3/2004 | Yeo et al. | 438/221 |
| 6,753,242 B2 * | 6/2004 | Yeap et al. | 438/595 |
| 6,846,734 B2 | 1/2005 | Amos et al. | |
| 6,911,379 B2 * | 6/2005 | Yeo et al. | 438/480 |
| 6,940,089 B2 * | 9/2005 | Cheng et al. | 257/19 |
| 7,022,561 B2 * | 4/2006 | Huang et al. | 438/197 |
| 7,026,249 B2 * | 4/2006 | Bedell et al. | 438/706 |
| 7,101,742 B2 * | 9/2006 | Ko et al. | 438/197 |
| 7,303,949 B2 * | 12/2007 | Chen et al. | 438/199 |
| 7,358,551 B2 * | 4/2008 | Chidambarrao et al. | 257/288 |
| 2006/0081875 A1 | 4/2006 | Lin et al. | |
| 2007/0020864 A1 | 1/2007 | Chong et al. | |

* cited by examiner

*Primary Examiner* — Steven Loke
*Assistant Examiner* — David Goodwin
(74) *Attorney, Agent, or Firm* — Ingrassia Fisher & Lorenz, P.C.

(57) ABSTRACT

An MOS device having enhanced mobility and a method for its fabrication are provided. The method comprises providing a P-type monocrystalline silicon germanium substrate having a first lattice constant and a channel region at the substrate surface, forming a gate insulator layer on the substrate, forming a gate electrode having a first sidewall and a second sidewall overlying the channel. First and second recesses are etched into the substrate in alignment with the first and the second gate electrode sidewalls, respectively. The recesses are filled by epitaxially growing a layer of embedded monocrystalline semiconductor material characterized by a second lattice constant less than the first lattice constant to impart a tensile strain on the channel region.

6 Claims, 6 Drawing Sheets

STRAINED MOS DEVICE AND METHODS FOR ITS FABRICATION

CROSS-REFERENCE TO RELATED APPLICATION

This application is a divisional of U.S. patent application Ser. No. 11/292,410, filed Nov. 30, 2005.

TECHNICAL FIELD

The present invention generally relates to strained MOS devices and to methods for the fabrication of such devices, and more particularly relates to strained NMOS, PMOS, and CMOS devices and to methods for their fabrication.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes.

The gain of an MOS transistor, usually defined by the transconductance ($g_m$), is proportional to the mobility of the majority carrier in the transistor channel. The current carrying capability and hence the performance of an MOS transistor is proportional to the mobility of the majority carrier in the channel. The mobility of holes, the majority carrier in a P-channel MOS (PMOS) transistor, can be increased by imparting a uniaxial compressive longitudinal strain to the channel. It is well known that a compressive longitudinal strain can be imparted to a silicon MOS transistor by embedding a material such as silicon germanium (SiGe) at the ends of the transistor channel. The mobility of electrons, the majority carrier in an N-channel MOS (NMOS) transistor, however, is decreased by such a compressive longitudinal strain imparted to the channel. The mobility of electrons in the channel of an NMOS transistor can be increased, however, by imparting a uniaxial tensile strain to the channel of the NMOS transistor.

Accordingly, it is desirable to provide NMOS devices having enhanced channel electron mobility. In addition, it is desirable to provide a method for fabricating a mobility enhanced NMOS device. Still further, it is desirable to provide compatible enhanced mobility NMOS and PMOS devices and methods for their fabrication. Furthermore, other desirable features and characteristics of the present invention will become apparent from the subsequent detailed description and the appended claims, taken in conjunction with the accompanying drawings and the foregoing technical field and background.

BRIEF SUMMARY

An MOS device having enhanced mobility is provided. In accordance with one embodiment of the invention the MOS device comprises a P-type monocrystalline silicon germanium substrate having a first lattice constant. A channel region is formed in the monocrystalline silicon germanium substrate and a gate electrode having a first sidewall and a second sidewall overlies the channel region. Regions of monocrystalline semiconductor material having a second lattice constant less than the first lattice constant are embedded in the monocrystalline silicon germanium substrate at the ends of the channel region in self alignment with the first and second sidewalls.

A method is provided for fabricating a strained MOS device. In accordance with one embodiment of the invention the method comprises providing a P-type monocrystalline silicon germanium substrate having a first lattice constant and a channel region at the substrate surface, forming a gate insulator layer on the substrate, and forming a gate electrode having a first sidewall and a second sidewall overlying the channel. First and second recesses are etched into the substrate in alignment with the first and the second gate electrode sidewalls, respectively. The recesses are filled by epitaxially growing a layer of embedded monocrystalline semiconductor material characterized by a second lattice constant less than the first lattice constant to impart a tensile strain to the channel region.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-7 illustrate, in cross section, a strain enhanced NMOS transistor 30 and methods for its fabrication in accordance with various embodiments of the invention. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
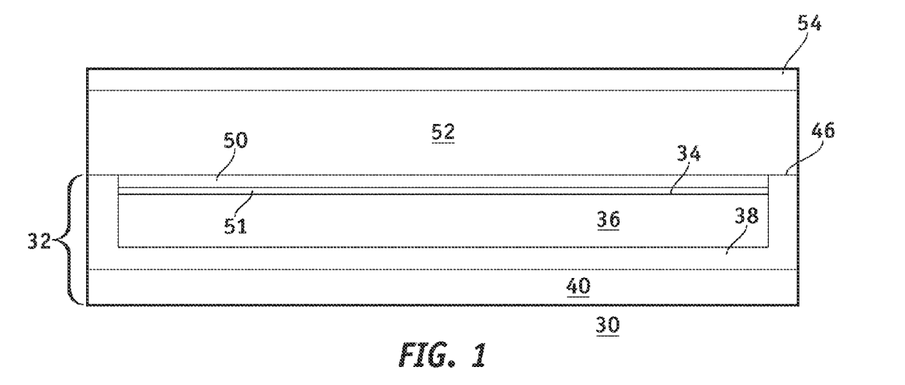
FIGS. 1-7 illustrate schematically, in cross section, a strained NMOS transistor and method steps for its fabrication in accordance with various embodiments of the invention.

As illustrated in cross section in FIG. 1, the manufacture of a strain enhanced MOS device 30, in accordance with an embodiment of the invention, begins with providing a monocrystalline silicon germanium (SiGe) substrate 32 having a surface 34. Preferably the monocrystalline silicon germanium (SiGe) substrate comprises silicon and between about 10 and 30 atomic percent germanium. As used herein, the terms "semiconductor substrate" or more specifically "silicon germanium substrate" will be used to encompass the relatively pure or lightly impurity doped substantially monocrystalline silicon germanium materials typically used in the semiconductor industry. The two terms, "semiconductor substrate" and "silicon germanium substrate" will be used interchangeably herein. Monocrystalline semiconductor substrate 32 can be a bulk semiconductor substrate, but preferably is a thin layer of P-doped monocrystalline silicon germanium material 36 on an insulating layer 38 which, in turn, is supported by a support wafer 40. Such a substrate is commonly referred to as a semiconductor on insulator (SOI) or silicon germanium on insulator (SGOI) substrate. Without loss of generality, but for convenience of description, substrate 32 will hereinafter be referred to as a silicon germanium on insulator or SGOI substrate or simply as a semiconductor substrate. Regardless of whether the substrate is a bulk wafer or a thin layer of semiconductor material on an insulating layer, an important characteristic of semiconductor substrate 32 is the lattice constant of the semiconductor material at surface 34 as will be explained more fully below. Pure monocrystalline silicon, for example, has a characteristic lattice constant. Silicon alloyed with germanium has a different, larger lattice constant, with the lattice constant increasing with increasing germanium content. Silicon alloyed with carbon, for example, has yet a different, smaller lattice constant with the lattice constant again dependent on the carbon content. Silicon germanium carbon has a lattice constant that depends on the amount of germanium and the amount of carbon. Increasing amounts of germanium increases the lattice constant while increasing amounts of carbon decrease the lattice constant.

Referring again to FIG. 1, the thin layer of silicon germanium material can be divided into active regions separated by isolating means such as shallow trench isolation (STI) 46. Shallow trench isolation (STI) 46 or other form of electrical isolation is formed in the semiconductor substrate and preferably extends through thin layer of silicon germanium 36 to insulating layer 38 to electrically isolate individual devices as required by the circuit function being implemented. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP). After forming the isolation means, a thin gate insulator layer 50 can be formed on the substrate surface followed by the deposition of a layer of gate electrode forming material 52 and, in accordance with an embodiment of the invention, a layer of hard mask material 54.

The gate insulator 50 may be a deposited insulator such as a silicon oxide, silicon nitride, a high dielectric constant insulator such as HfSiO, or the like. Deposited insulators can be deposited, for example, by chemical vapor deposition (CVD), low pressure chemical vapor deposition (LPCVD), or plasma enhanced chemical vapor deposition (PECVD). Alternatively, a thin layer of biaxially tensile strained silicon 51 having a thickness of about 10 nm is epitaxially grown on surface 34 of the silicon germanium layer 36. Methods for the epitaxial growth of such layers are well known and need not be described here. The thin strained silicon layer can then be thermally oxidized to form a layer of silicon dioxide. As illustrated in FIG. 1, gate insulator 50 is a thermally grown silicon dioxide layer grown on thin strained silicon layer 51. The gate insulator material is typically 1-10 nanometers (nm) in thickness. The gate electrode forming material 52 can be, for example, a layer of polycrystalline silicon preferably deposited as undoped polycrystalline silicon and subsequently impurity doped by ion implantation. The polycrystalline material can be deposited, for example, to a thickness of about 100 nm by LPCVD by the hydrogen reduction of silane. Hard mask material 54 can be, for example, silicon oxide, silicon nitride, or silicon oxynitride deposited onto the surface of the polycrystalline silicon. The hard mask material can be deposited to a thickness of about 50 nm, also by LPCVD.

Figure 2:
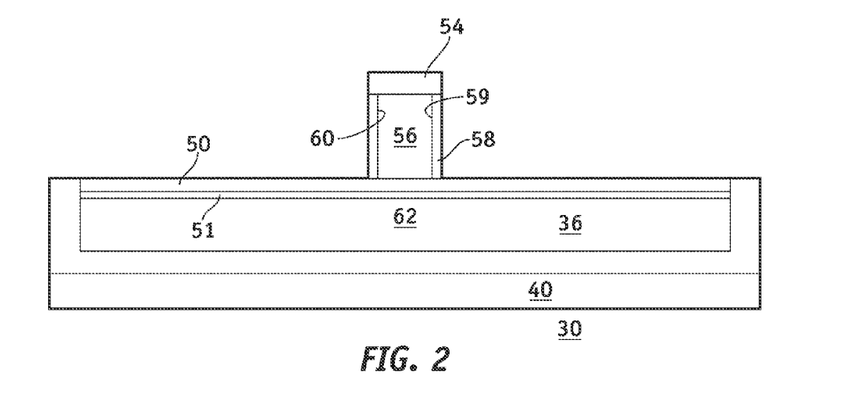

As illustrated in FIG. 2, hard mask material 54 and gate electrode forming material 52 are photolithographically patterned and etched to form a gate electrode 56. The polycrystalline silicon can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry. Following the patterning of the gate electrode, in accordance with one embodiment of the invention, a thin layer 58 of silicon oxide is thermally grown on the opposing sidewalls 59 and 60 of gate electrode 56. The thin oxide can have a thickness, for example, of about 2-5 nm. The formation of gate electrode 56 defines a channel region 62 as that portion at the surface of silicon germanium layer 36 underlying the gate electrode.

Figure 3:
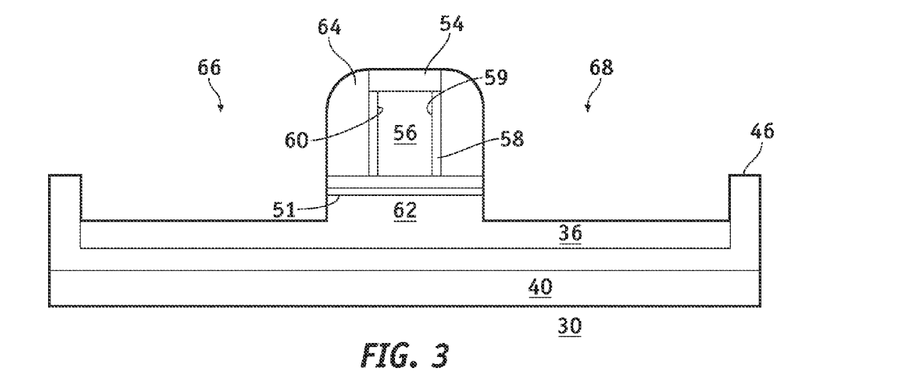

The method in accordance with one embodiment of the invention continues, as illustrated in FIG. 3 by depositing a layer of silicon nitride or other spacer forming material and anisotropically etching the layer to form spacers 64 overlying thin layer 58 of silicon oxide on sidewalls 59 and 60. The silicon nitride layer can be deposited to a thickness of about 50-500 nm by LPCVD using dichlorosilane and ammonia as reactants. The sidewall spacers can be anisotropically etched, for example by reactive ion etching (RIE), using a $CF_4$ or $CHF_3$ chemistry. Recesses 66 and 68 are etched through strained silicon layer 51 and into silicon germanium thin substrate layer 36 using spacers 64, gate electrode 56, and STI 46 as etch masks. Because the sidewall spacers are used as an etch mask, the recesses are self aligned to sidewalls 59 and 60 of gate electrode 56 and to channel 62. Recesses 66 and 68 can be etched, for example, by reactive ion etching (RIE) using a $HBr/O_2$ chemistry to a depth of about 300-600 nm.

Figure 4:
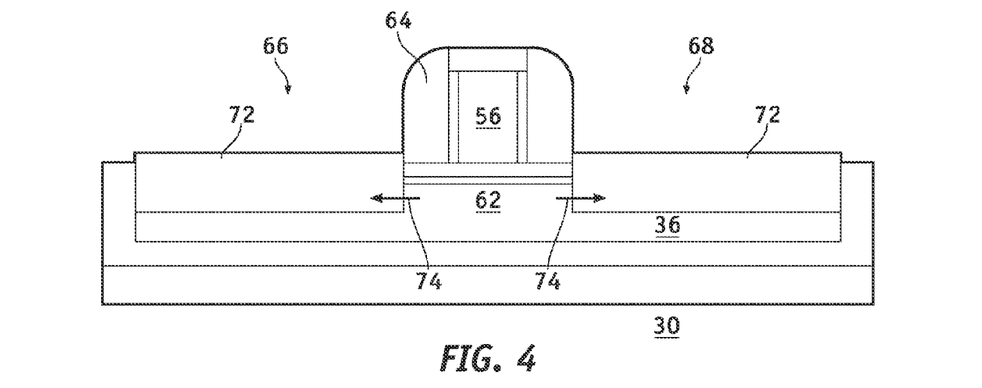

As illustrated in FIG. 4, recesses 66 and 68 are filled by selectively growing an epitaxial film of semiconductor material 72 having a lattice constant less than the lattice constant of the silicon germanium layer 36. Methods for epitaxially growing a layer of semiconductor material on a semiconductor host in a selective manner are well known and need not be described herein. Semiconductor material 72 can be silicon, silicon carbon, silicon germanium carbon, or silicon germanium having a germanium content less than the germanium content of layer 36. By embedding a semiconductor material having a lattice constant less than the lattice constant of silicon germanium layer 36 a tensile stress is applied to channel 62 as schematically illustrated by arrows 74. Electrons in tensile strained channel 62 have an enhanced mobility compared to electrons in unstrained silicon germanium.

Figure 5:
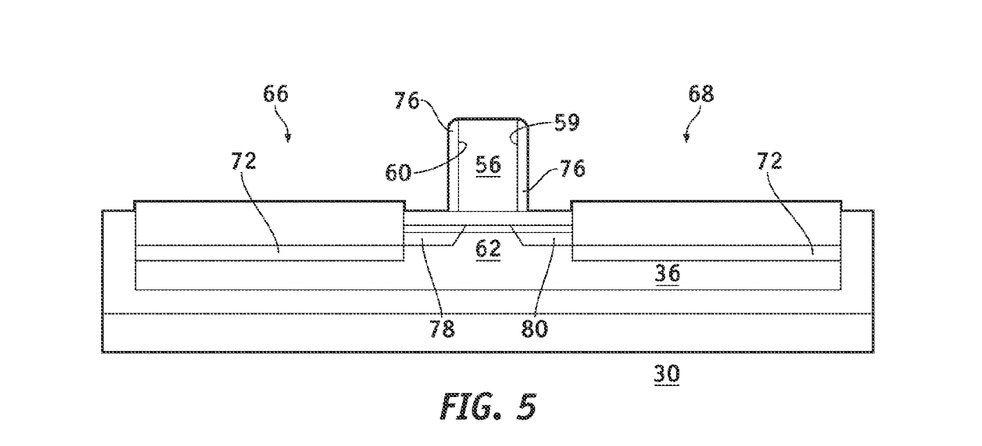

In accordance with one embodiment of the invention, as illustrated in FIG. 5, silicon nitride spacers 64 and hard mask 54 are removed and a silicon oxide layer is deposited and anisotropically etched to form offset spacers 76 on opposing sidewalls 59 and 60 of gate electrode 56. The silicon oxide layer can be deposited, for example, by LPCVD using a tetraethylorthosilicate (TEOS) source, to a thickness of about 70-160 nm. The oxide layer can be etched by RIE using a $CHF_3$ to $CF_4$ chemistry. N-type source 78 and drain 80 extension and HALO implants can now be performed in conventional manner by using the offset spacers as ion implantation masks. The ions are implanted into embedded semiconductor material 72 and the exposed portions of silicon germanium layer 36.

Figure 6:
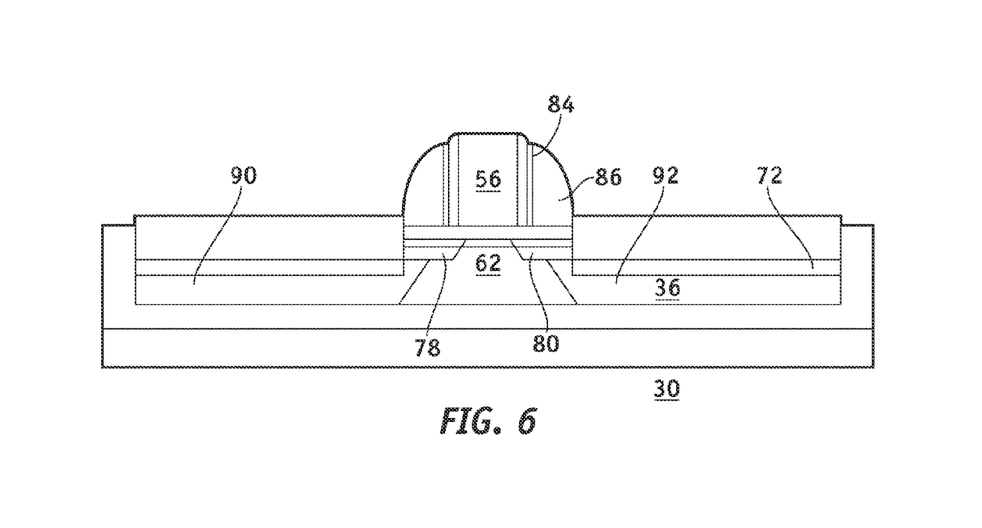

In accordance with one embodiment of the invention, a layer of silicon oxide and then a layer of silicon nitride are deposited and anisotropically etched to form a silicon oxide liner 84 and a silicon nitride sidewall spacer 86 overlying offset spacers 76 on the opposing sidewalls of gate electrode 56 as illustrated in FIG. 6. The silicon oxide layer can be deposited, for example, by LPCVD or PECVD using silane and oxygen as a deposition source to a depth of about 3-9 nm, and the silicon nitride layer can be deposited, for example, by PECVD to a depth of about 30-100 nm. The two layers can be anisotropically etched, for example, by RIE using a $CHF_3$/$CF_4$ chemistry. Offset spacers 76, oxide liner 84, sidewall spacers 86 and gate electrode 56 are collectively used as ion implantation masks and N-type conductivity determining ions are implanted into embedded semiconductor material 72 and the unmasked portion of silicon germanium layer 36 to form deep source 90 and drain 92 buffer regions. Preferably the buffer regions extend through the thickness of layer 36 to the underlying oxide 38.

Figure 7:
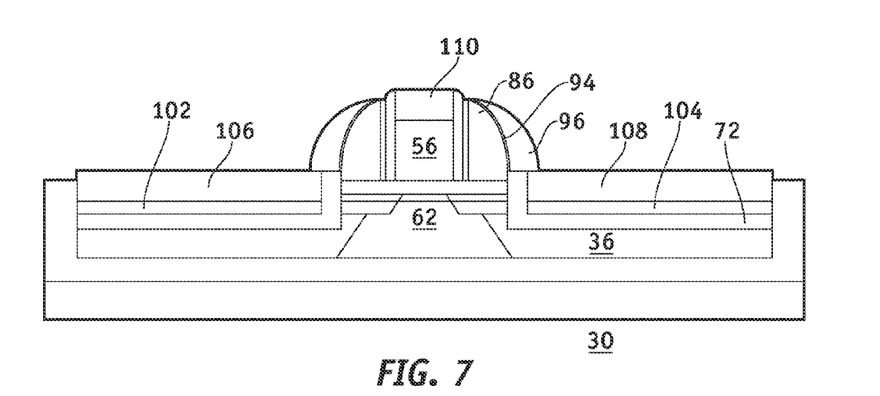

In a similar manner a second silicon oxide liner 94 and a second silicon nitride sidewall spacer 96 are formed over sidewall spacers 86 as illustrated in FIG. 7. The sidewall spacers and gate electrode 56 are used as ion implantation masks and N-type conductivity determining ions are implanted into embedded semiconductor material 72 to form heavily doped source 102 and drain 104 regions. The implanted ions are activated by heating, for example by rapid thermal annealing. A silicide forming metal such as cobalt or nickel is deposited and thermally annealed, for example by rapid thermal annealing, to form metal silicide contacts 106, 108, and 110 to the source, drain, and gate electrode, respectively. The metal silicide does not form on the sidewall spacers or STI, and any of the unreacted silicide forming metal can be removed from the spacers and STI by wet etching in a $H_2O_2$/$H_2SO_4$ or $HNO_3$/HCl solution.

Stressed MOS device 30 can be completed by well known steps (not illustrated) such as depositing a layer of dielectric material, etching opening through the dielectric material to expose portions of the silicide on the source and drain regions, and forming metallization that extends through the openings to electrically contact the source and drain regions. Further layers of interlayer dielectric material, additional layers of interconnect metallization, and the like may also be applied and patterned to achieve the proper circuit function of the integrated circuit being implemented.

Figure 8:
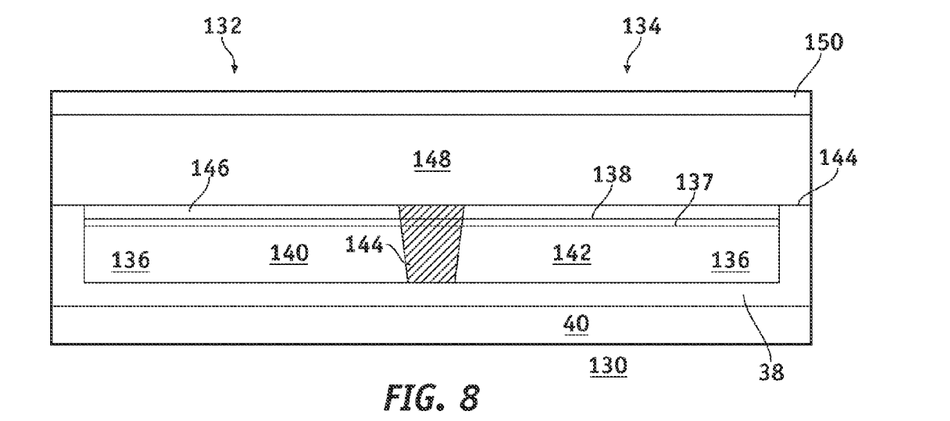
FIGS. 8-15 illustrate schematically, in cross section, a CMOS device and method steps for its fabrication in accordance with various alternate embodiments of the invention.

FIGS. 8-15 illustrate, in cross section, a complementary MOS (CMOS) device 130 in accordance with a further embodiment of the invention. Many of the process steps used in the fabrication of CMOS device 130 are similar to process steps used in the fabrication of device 30 and so will not be described again in detail. As illustrated in FIG. 8, CMOS device 130 includes a strain enhanced NMOS transistor 132 and a PMOS transistor 134. Like device 30 illustrated above, CMOS device 130 is fabricated in and on a silicon germanium substrate 136. Preferably silicon germanium substrate 136 is a SGOI substrate, but can also be a bulk substrate. The underlying insulating layer and support wafer can be similar to insulating layer 38 and support wafer 40 described above. Silicon germanium substrate 136 contains an amount of germanium between about 10 and 30 atomic percent. Preferably a layer 138 of strained silicon having a thickness of about 10 nm is epitaxially grown on surface 137 of substrate 136. Silicon germanium substrate 136 is divided into electrically isolated active regions 140 and 142 by shallow trench isolation 144. Active region 140 is doped P-type, for example by ion implantation and active region 142 is doped N-type. As is well known, active region 140 can be masked by a patterned layer of photoresist (not illustrated) while active region 142 is being ion implanted and active region 142 can similarly be masked while active region 140 is being ion implanted. A layer of gate insulating material 146, either thermally grown or deposited, is formed overlying the layer of strained silicon. A layer of polycrystalline silicon or other gate electrode forming material 148 is deposited over the layer of gate insulating material, and a layer of hard mask material 150 such as silicon nitride is deposited onto the top surface of the gate electrode forming material.

Figure 9:
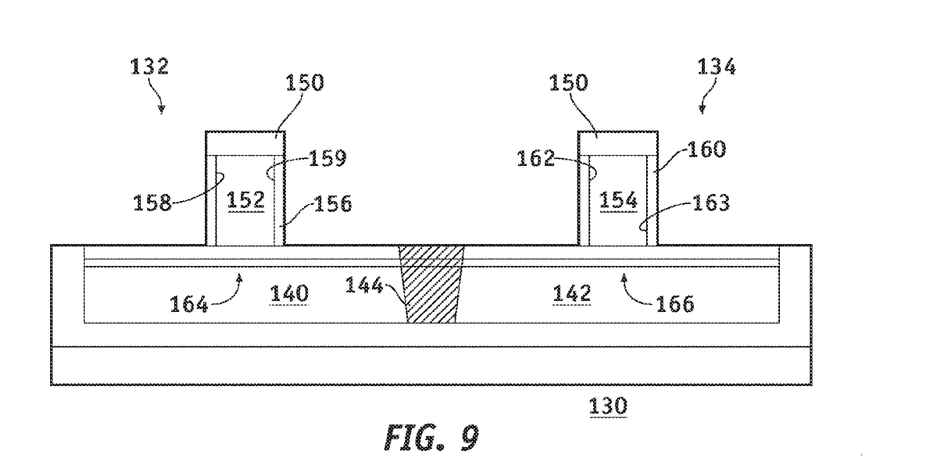

As illustrated in FIG. 9, hard mask material 150 and gate electrode forming material 148 are photolithographically patterned and etched to form gate electrode 152 of NMOS transistor 132 and gate electrode 154 of PMOS transistor 134. Following the patterning of the gate electrodes, in accordance with one embodiment of the invention, a thin layer 156 of silicon oxide is thermally grown on the opposing sidewalls 158 and 159 of gate electrode 152 and a thin layer of silicon oxide 160 is thermally grown on the opposing sidewalls 162 and 163 of gate electrode 154. The thin oxides can have a thickness, for example, of about 2-5 nm. The formation of gate electrode 152 defines a channel region 164 as that portion of P-type active region 140 at the surface of silicon germanium layer 136 underlying gate electrode 152. Similarly, the formation of gate electrode 154 defines a channel region 166 of PMOS transistor 134 as that portion of N-type active region 142 at the surface of silicon germanium layer 136 underlying gate electrode 154.

Figures 10, 11:
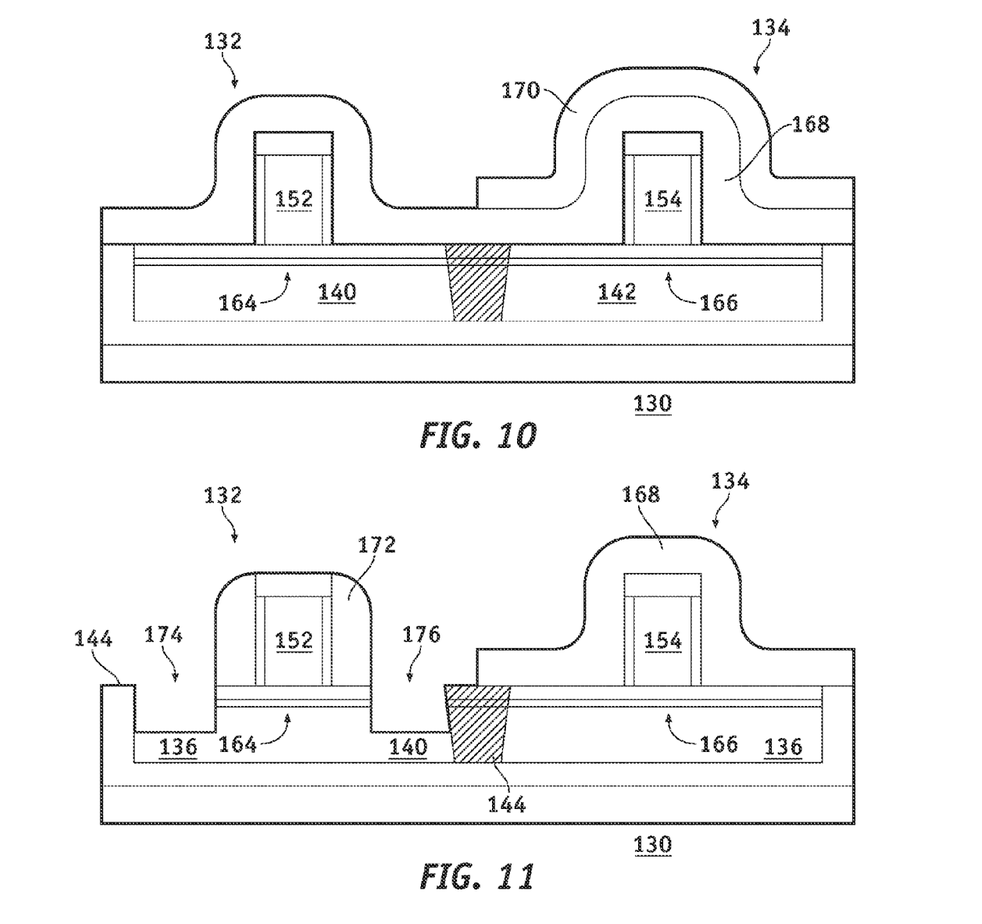

The method in accordance with an embodiment of the invention continues, as illustrated in FIG. 10 by depositing a layer of silicon nitride or other spacer forming material 168 overlying the gate electrodes and the surface of silicon germanium layer 136. A layer of photoresist 170 is applied over the layer of spacer forming material and is photolithographically patterned to leave a masking layer of photoresist over PMOS transistor 134. The layer of photoresist material is removed over NMOS transistor 132 to expose the spacer forming material overlying the NMOS transistor.

As illustrated in FIG. 11, the exposed spacer forming material is anisotropically etched, for example by reactive ion etching to form sidewall spacers 172 on the opposing sidewalls of gate electrode 152. During the anisotropic etching of spacer forming material 168, patterned photoresist layer 170 protects that portion of layer 168 overlying PMOS transistor 134 so that that portion of the layer of spacer forming material remains intact. Sidewall spacers 172, the remaining unetched portion of layer 168, and STI 144 (and perhaps patterned photoresist layer 170) are subsequently used as an etch mask and recesses 174 and 176 are etched through strained silicon layer 138 and into silicon germanium layer 136 in active region 140. By using sidewall spacers 172 as an etch mask, recesses 174 and 176 are etched in self alignment with opposing sidewalls 158 and 159 of gate electrode 152 and channel region 164.

Figure 12:
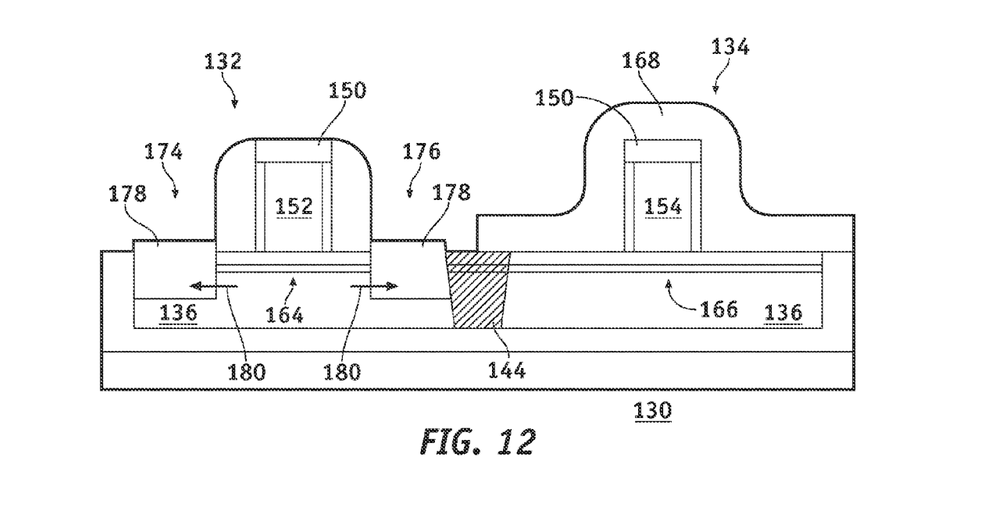

As illustrated in FIG. 12, recesses 174 and 176 are filled by selectively growing an epitaxial film of semiconductor material 178 having a lattice constant less than the lattice constant of the silicon germanium layer 136. Semiconductor material 178 can be silicon, silicon carbon, silicon germanium carbon, or silicon germanium having a germanium content less than the germanium content of layer 136. By embedding a semiconductor material having a lattice constant less than the lattice constant of silicon germanium layer 136 a tensile stress is applied to channel 164 as schematically illustrated by arrows 180. Electrons in tensile strained channel 164 have an enhanced mobility compared to electrons in unstrained silicon germanium. During the selective growth of semiconductor material 178 to fill recesses 174 and 176 the remaining portion of sidewall spacer forming layer 168 prevents the growth of semiconductor material on PMOS transistor 134.

Figure 13:
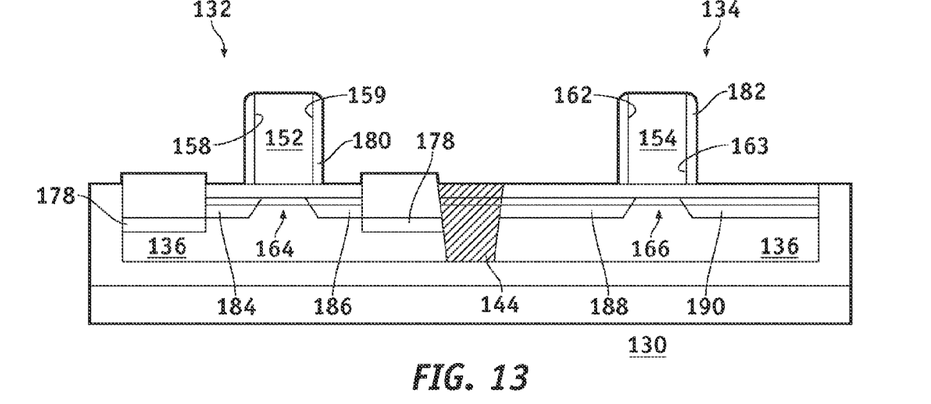

In accordance with one embodiment of the invention the process continues, as illustrated in FIG. 13 by stripping sidewall spacers 172, the remainder of sidewall spacer forming layer 168 and hard mask layer 150. A layer of silicon oxide is deposited and anisotropically etched to form offset spacers 180 on opposing sidewalls 158 and 159 of gate electrode 152 and to form offset spacers 182 on opposing sidewalls 162 and 163 of gate electrode 154. N-type source 184 and drain 186 extension and HALO implants can now be performed in conventional manner in NMOS transistor 132 by using offset spacers 180 as ion implantation masks. A layer of patterned photoresist (not illustrated) masks PMOS transistor 134 during the implants into NMOS transistor 132. The ions are implanted into embedded semiconductor material 178 and the exposed portions of silicon germanium layer 136. In similar manner P-type source 188 and drain 190 extension and HALO implants can now be performed in conventional manner in PMOS transistor 134 by using offset spacers 182 as ion implantation masks. A layer of patterned photoresist (not illustrated) masks NMOS transistor 132 during the implants into PMOS transistor 134. The ions are implanted into the exposed portions of silicon germanium layer 136.

Figure 14:
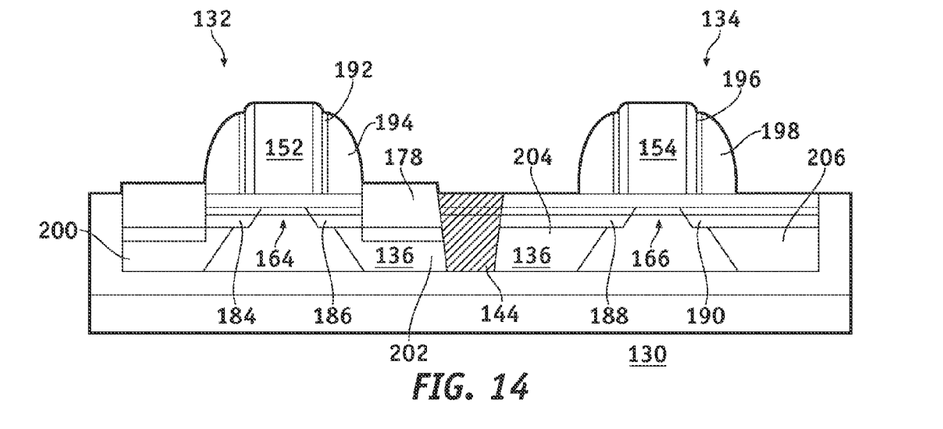

In a manner similar to that described above with respect to the fabrication of NMOS transistor 30, the method in accordance with one embodiment of the invention continues by depositing a layer of silicon oxide and then a layer of silicon nitride. The layers of silicon oxide and silicon nitride are anisotropically etched to form a silicon oxide liner 192 and a silicon nitride sidewall spacer 194 overlying offset spacers 180 on the opposing sidewalls of gate electrode 152 and a silicon oxide liner 196 and a silicon nitride sidewall spacer 198 overlying offset spacers 182 on the opposing sidewalls of gate electrode 154 as illustrated in FIG. 14. Sidewall spacers 194 and gate electrode 152 are used as ion implantation masks and N-type conductivity determining ions are implanted into embedded semiconductor material 178 and the unmasked portion of silicon germanium layer 136 to form deep source 200 and drain 202 buffer regions of NMOS transistor 132. Preferably the buffer regions extend through the thickness of layer 136 to the underlying oxide. During the implantation of the N-type ions, PMOS transistor 134 can be masked by a layer of patterned photoresist (not illustrated). After stripping the layer of photoresist covering PMOS transistor 134, another layer of photoresist (not illustrated) can be applied and patterned to mask NMOS transistor 132. The patterned layer of photoresist, sidewall spacers 198 and gate electrode 154 are used as an ion implantation mask and P-type conductivity determining ions are implanted into silicon germanium layer 136 to form deep source 204 and drain 206 regions of PMOS transistor 134. Preferably the buffer regions extend through the thickness of layer 136 to the underlying oxide.

Figure 15:
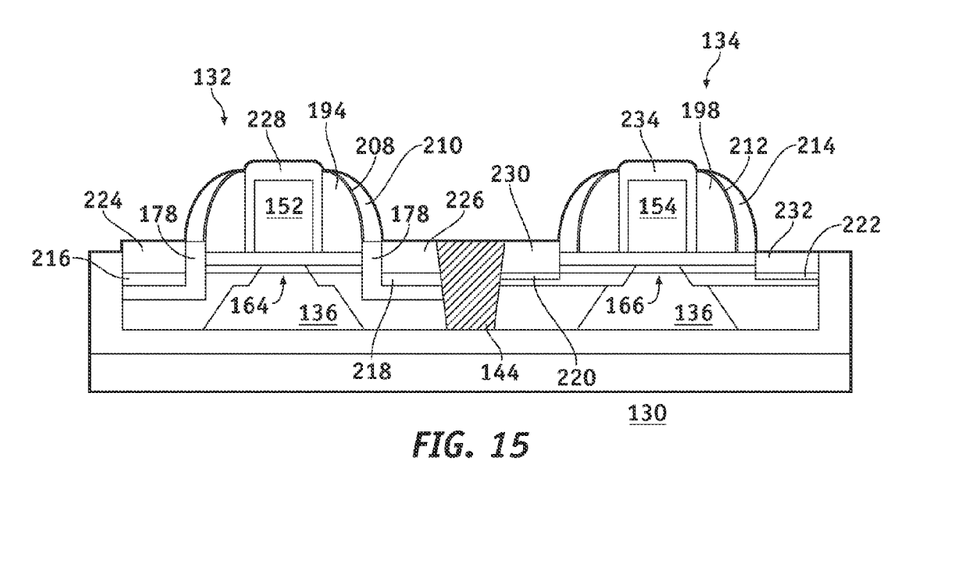

Again, in a manner similar to that described above with respect to the fabrication of NMOS transistor 30, the method in accordance with one embodiment of the invention continues by forming a second silicon oxide liner 208 and a second silicon nitride sidewall spacer 210 over sidewall spacers 194 and a second silicon oxide liner 212 and a second silicon nitride sidewall spacer 214 over sidewall spacers 198 as illustrated in FIG. 15. The sidewall spacers and gate electrode 152, together with a patterned layer of photoresist (not illustrated) that masks PMOS transistor 134, are used as ion implantation masks and N-type conductivity determining ions are implanted into embedded semiconductor material 178 to form heavily doped source 216 and drain 218 regions of NMOS transistor 132. After removing the layer of patterned photoresist, another layer of photoresist (not illustrated) is applied and patterned to mask NMOS transistor 132. The patterned layer of photoresist together with sidewall spacers 198 and 214 and gate electrode 154 are used as ion implantation masks and P-type conductivity determining ions are implanted into silicon germanium layer 136 to form heavily doped source 220 and drain 222 regions of PMOS transistor 134. The implanted ions are activated by heating, for example by rapid thermal annealing. A silicide forming metal such as cobalt or nickel is deposited and thermally annealed, for example by rapid thermal annealing, to form metal silicide contacts 224, 226, and 228 to the source, drain, and gate electrode, respectively of NMOS transistor 132 and metal silicide contacts 230, 232, and 234 to the source, drain, and gate electrode, respectively of PMOS transistor 134.

CMOS device 130 can be completed by well known steps (not illustrated) such as depositing a layer of dielectric material, etching opening through the dielectric material to expose portions of the silicide on the source and drain regions, and forming metallization that extends through the openings to electrically contact the source and drain regions. Further layers of interlayer dielectric material, additional layers of interconnect metallization, and the like may also be applied and patterned to achieve the proper circuit function of the integrated circuit being implemented.

Figure 16:
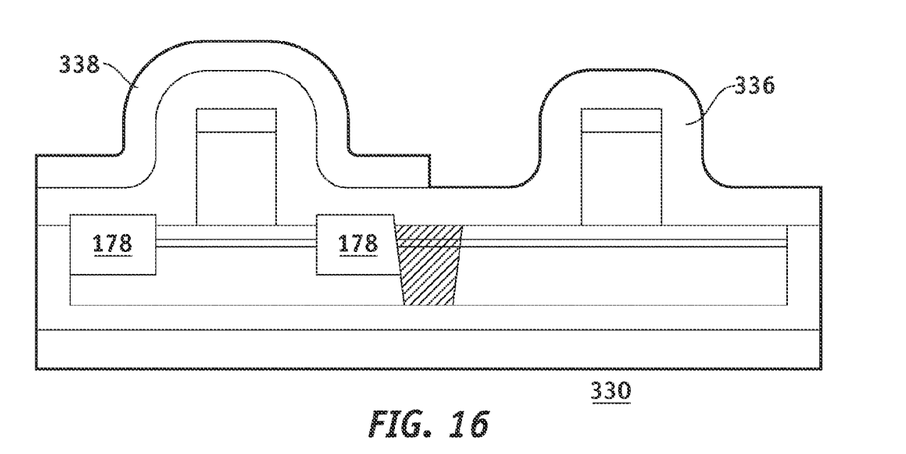
FIGS. 16-18 together with FIGS. 8-12 illustrate schematically, in cross section, a CMOS device and method steps for its fabrication in accordance with yet other embodiments of the invention.
Figure 17:
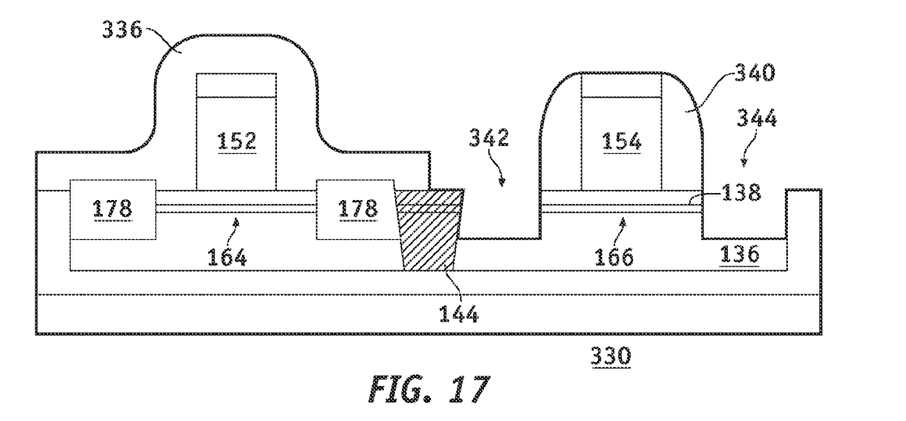
Figure 18:
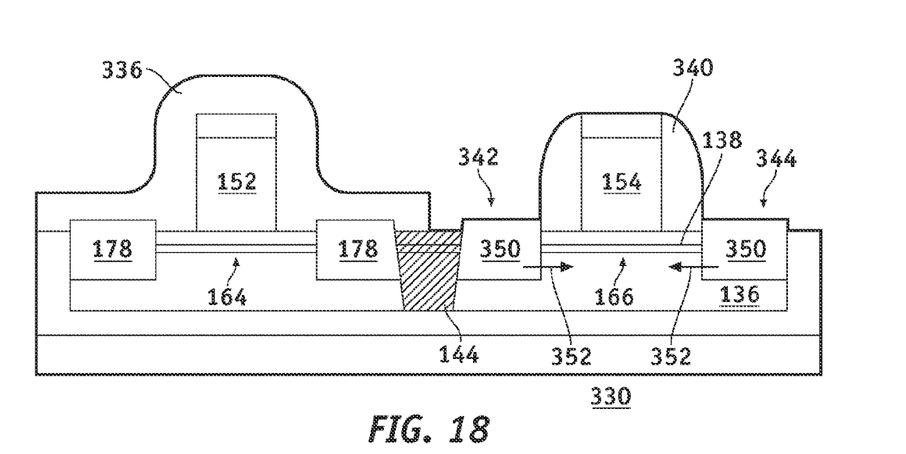

FIGS. 16-18 together with previous FIGS. 8-12 illustrate, in cross section, a complementary MOS (CMOS) device 330 in accordance with yet a further embodiment of the invention. CMOS device 330 includes a strained NMOS transistor identical to and fabricated in a manner similar to strained NMOS transistor 132 described above. CMOS device 330 also includes a strained PMOS transistor 332. Initial method steps in accordance with this embodiment of the invention are similar to the method steps illustrated in FIGS. 8-12 above. Again, because many of these method steps are similar to those described above, the details need not be repeated.

Starting with CMOS device 330 in the state of fabrication illustrated in FIG. 12, sidewall spacers 172 and the remainder of silicon nitride layer 168 are removed. A portion of hard mask layer 150 on gate electrodes 152 and 154 is retained. Another layer of silicon nitride or other spacer forming material 336 is deposited overlying the gate electrodes and the surface of silicon germanium layer 136 as illustrated in FIG. 16. A layer of photoresist 338 is applied over the layer of spacer forming material and is photolithographically patterned to leave a masking layer of photoresist over NMOS transistor 132. The layer of photoresist material is removed over PMOS transistor 332 to expose the spacer forming material overlying the PMOS transistor.

As illustrated in FIG. 17, the exposed spacer forming material is anisotropically etched, for example by reactive ion etching to form sidewall spacers 340 on the opposing sidewalls of gate electrode 154. During the anisotropic etching of spacer forming material 336, patterned photoresist layer 338 protects that portion of layer 336 overlying NMOS transistor 132 so that that portion of the layer of spacer forming material remains intact. Sidewall spacers 340, the remaining unetched portion of layer 336, and STI 144 (and perhaps patterned photoresist layer 338) are subsequently used as an etch mask and recesses 342 and 344 are etched through strained silicon layer 138 and into silicon germanium layer 136 in active region 142. By using sidewall spacers 340 as an etch mask, recesses 342 and 346 are etched in self alignment with opposing sidewalls 162 and 163 of gate electrode 154 and channel region 166.

As illustrated in FIG. 18, recesses 342 and 344 are filled by selectively growing an epitaxial film of semiconductor material 350 having a lattice constant greater than the lattice constant of the silicon germanium layer 136. Semiconductor material 350 can be, for example, silicon germanium having a greater atomic percentage of germanium than does silicon germanium layer 136. By embedding a semiconductor material having a lattice constant greater than the lattice constant of silicon germanium layer 136 a compressive stress is applied to channel 166 as schematically illustrated by arrows 352. Majority carrier holes in compressive strained channel 166 have an enhanced mobility compared to holes in unstrained silicon germanium.

In accordance with one embodiment of the invention, CMOS device 330 can be completed by using the same method steps described above with respect to FIGS. 13-15. Because the same method steps are employed, the description thereof need not be repeated again.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A CMOS device comprising:
   a silicon germanium on insulator (SGOI) substrate comprising:
      a support wafer;
      an insulating layer overlying the support wafer; and
      a layer of monocrystalline silicon germanium material having a first lattice constant on the insulating layer, the layer of monocrystalline silicon germanium material having a first P-type region and a second N-type region;
   a gate electrode overlying the first P-type region;
   a first channel region having opposing sides in the first P-type region and being located below the gate electrode;
   a biaxially tensile strained silicon layer interposed between the gate electrode and the first channel region and overlying a portion of the surface of the first P-type region;
   a gate insulator layer disposed under the gate electrode and overlying the biaxially tensile strained silicon layer; and
   regions of first monocrystalline semiconductor material embedded at the opposing sides of the first channel, the first monocrystalline semiconductor material comprising silicon and germanium, the first monocrystalline semiconductor material having a second lattice constant less than the first lattice constant and being doped with conductivity determining ions, wherein the first monocrystalline semiconductor material comprises: heavily doped source and drain regions formed in the first P-type region at the opposing sides of the first channel; and
   implanted source and drain buffer regions formed in the layer of monocrystalline silicon germanium material, wherein the implanted source and drain buffer regions underlie the heavily doped source and drain regions in the first P-type region at the opposing sides of the first channel, the implanted source and drain buffer regions extending through the layer of monocrystalline silicon germanium material to the insulating layer,
   oxide layers formed on sidewalls of the gate electrode;
   a first spacer adjacent one of the oxide layers and overlying the biaxially tensile strained silicon layer, the first spacer being in physical contact with the gate insulator layer and a portion of the first monocrystalline semiconductor material; and
   a liner layer interposed between the one of the oxide layers and the first spacer.

2. The CMOS device of claim 1 further comprising:
   a second channel region having opposing sides in the second N-type region; and regions of second monocrystalline semiconductor material embedded at the opposing sides of the second channel, the second monocrystalline semiconductor material having a third lattice constant greater than the first lattice constant.

3. The CMOS device of claim 2 wherein the SGOI substrate comprises silicon and germanium having a first atomic percentage of germanium, the first monocrystalline semiconductor material having a second atomic percentage of germanium, the second atomic percentage being less than the first atomic percentage, and the second monocrystalline semiconductor material comprises silicon and germanium having a third atomic percentage of germanium, the third atomic percentage being greater than the first atomic percentage.

4. The CMOS device of claim 1 wherein the first monocrystalline semiconductor material further comprises carbon.

5. The CMOS device of claim 1 wherein the layer of monocrystalline silicon germanium material comprises silicon and between about 10 and 30 atomic percent germanium.

6. The CMOS device of claim 1 further comprising:
   a second spacer adjacent the first spacer and in physical contact with the portion of the first monocrystalline semiconductor material.

\* \* \* \* \*